(12) United States Patent
Lee et al.

(10) Patent No.: US 6,448,128 B1
(45) Date of Patent: Sep. 10, 2002

(54) CAPACITOR FOR SEMICONDUCTOR MEMORY DEVICE AND METHOD OF MANUFACTURING THE SAME

(75) Inventors: Kee Jeung Lee, Seoul; Dong Jun Kim, Kyoungki-do, both of (KR)

(73) Assignee: Hyundai Electronics Industries Co., Ltd. (KR)

( * ) Notice: Subject to any disclaimer, the term of this patent is extended or adjusted under 35 U.S.C. 154(b) by 160 days.

(21) Appl. No.: 09/607,290

(22) Filed: Jun. 30, 2000

(30) Foreign Application Priority Data

Jul. 1, 1999 (KR) .............................. 99-26386

(51) Int. Cl.$^7$ ............................................. H01L 82/42
(52) U.S. Cl. ........................................ 438/240; 438/785
(58) Field of Search ........................... 438/685, 762, 438/778, 785, 680, 395, 398, 238, 240, 253

(56) References Cited

U.S. PATENT DOCUMENTS

| | | | |
|---|---|---|---|
| 4,130,694 A | 12/1978 | Glass et al. | |
| 5,452,178 A | 9/1995 | Emesh et al. | |
| 5,569,619 A | 10/1996 | Roh | |
| 5,631,188 A | 5/1997 | Chang et al. | |
| 5,741,721 A | 4/1998 | Stevens | |
| 5,753,945 A | 5/1998 | Chivukula et al. | |
| 5,763,300 A | 6/1998 | Park et al. | |
| 5,776,660 A | 7/1998 | Hakey et al. | |
| 5,837,576 A | 11/1998 | Chen et al. | |
| 5,841,186 A * | 11/1998 | Sun et al. | 257/635 |
| 5,859,760 A | 1/1999 | Park et al. | |
| 5,872,415 A | 2/1999 | Dreifus et al. | |
| 5,910,880 A | 6/1999 | DeBoer et al. | |
| 5,936,831 A | 8/1999 | Kola et al. | |
| 5,980,977 A | 11/1999 | Deng et al. | |
| 6,087,261 A * | 7/2000 | Nishikawa et al. | 438/685 |
| 6,204,203 B1 * | 3/2001 | Narwankar et al. | 438/785 |
| 6,218,260 B1 * | 4/2001 | Lee et al. | 438/398 |
| 6,339,009 B1 * | 1/2002 | Lee et al. | 438/396 |
| 6,352,865 B2 * | 3/2002 | Lee et al. | 438/3 |

FOREIGN PATENT DOCUMENTS

| | | |
|---|---|---|
| JP | 63038248 | 2/1980 |
| JP | 62136035 | 6/1987 |
| JP | 01173622 | 7/1989 |
| JP | 11233723 | 8/1990 |
| JP | 02226754 | 9/1990 |
| JP | 05335483 | 12/1993 |
| JP | 06163819 | 6/1994 |
| JP | 7014993 | 1/1995 |
| JP | 07045467 | 2/1995 |
| JP | 05167008 | 7/1998 |
| JP | 110074478 | 3/1999 |
| JP | 11191612 | 7/1999 |

* cited by examiner

Primary Examiner—Caridad Everhart
Assistant Examiner—Calvin Lee
(74) Attorney, Agent, or Firm—Pillsbury Winthrop LLP

(57) ABSTRACT

Disclosed are a capacitor for semiconductor capable of increasing storage capacitance as well as preventing leakage current and a method of manufacturing the same. According to the present invention. A lower electrode is formed on a semiconductor substrate. The surface of the lower electrode is surface-treated so as to prevent a natural oxide layer from generating on the surface thereof. A $(TaO)_{1-x}(TiO)N$ layer as a dielectric is deposited on the upper part of the lower electrode. Afterwards, to crystallize the $(TaO)_{1-x}(TiO)N$ layer, a thermal-treatment is performed. Next, an upper electrode is formed on the upper part of the $(TaO)_{1-x}(TiO)N$ layer.

33 Claims, 3 Drawing Sheets

CAPACITOR FOR SEMICONDUCTOR MEMORY DEVICE AND METHOD OF MANUFACTURING THE SAME

FIELD OF THE INVENTION

The present invention relates to a capacitor for semiconductor memory device and a method of manufacturing the same, and more particularly to a capacitor for semiconductor memory device capable of increasing the storage capacitance as well as preventing leakage current and a method of manufacturing the same.

BACKGROUND OF THE INVENTION

As the number of memory cells composing DRAM semiconductor device has been recently increased, occupancy area of each memory cell is gradually decreased. Meanwhile, capacitors formed in the respective memory cells require a sufficient capacitance for precise reading out of storage data. Accordingly, the current DRAM semiconductor device requires memory cells in which capacitors having larger capacitance as well as occupying small area are formed. The capacitance of a capacitor can be increased by using an insulator having high dielectric constant as a dielectric layer, or by enlarging the surface area of a lower electrode. In a highly integrated DRAM semiconductor device, a $Ta_2O_5$ layer having a higher dielectric constant than that of the nitride-oxide(NO) is now used as a dielectric, thereby forming a lower electrode of a 3-Dimentional structure.

FIG. 1 is a cross-sectional view showing a capacitor for a conventional semiconductor memory device. Referring to FIG. 1, a gate electrode 13 including a gate insulating layer 12 at a lower portion thereof is formed according to a known technique on the upper part of a semiconductor substrate 10 which a field oxide layer 11 is formed at a selected portion thereof. A junction region 14 is formed on the semiconductor substrate 10 at both sides of the gate electrode 13, thereby forming an MOS transistor. A first interlayer insulating layer 16 and a second interlayer insulating layer 18 are formed on the upper part of the semiconductor substrate 10 which the MOS transistor is formed therein. A storage node contact hole h is formed inside the first and the second interlayer insulating layers 16,18 so that the junction region 14 is exposed. A cylinder type lower electrode 20 is formed according to a known method, inside the storage node contact hole h so as to be in contact with the exposed junction region 14. A HSG(hemi-spherical grain) layer 21 is formed on a surface of a lower electrode 20 to increase the surface area of the lower electrode 20 more. A tantalum oxide layer 23 is formed on the surface of the HSG layer 21. Afterwards, the $Ta_2O_5$ layer 23 is deposited on the upper part of the lower electrode 20 including the HSG layer 21 by using an organic metal precursor such as $Ta(OC_2H_5)_5$. Afterwards, the $Ta_2O_5$ layer 23 is thermal-treated at a selected temperature so as to crystallize. An upper electrode 25 is formed of a polysilicon layer or a metal layer doped on the upper part of the $Ta_2O_5$ layer 23.

However, a difference in the composition rate of Ta and O is generated since the $Ta_2O_5$ layer 23 generally has unstable stoichiometry. As a result, substitutional Ta atoms, i.e. vacancy atoms are generated in a thin film. Since those vacancy atoms are oxygen vacancies, leakage current is generated.

Now, a process for oxidizing the $Ta_2O_5$ layer has been additionally performed to remove the substitutional Ta atoms therein. However, when performing this oxidizing process, an oxide reaction of the $Ta_2O_5$ layer with the upper and the lower electrodes actively progresses. As a result, an oxide layer having a low dielectric constant is formed on the interface between the $Ta_2O_5$ layer and the lower electrode or the upper electrode, thereby deteriorating the homogeneity of the interface and increasing the thickness of an effective oxide layer as well as manufacturing process steps.

Moreover, since the $Ta_2O_5$ layer is formed by a reaction between an organic tantalum precursor containing carbon components and oxygen, reaction impurities such as carbon atoms (C), carbon compounds($CH_4$, $C_2H_4$), and $H_2O$ remain therein after the deposition process. These reaction by-products cause leakage current and deteriorate the dielectric strength of the $Ta_2O_5$ layer.

To remove these reaction by-products, the $Ta_2O_5$ layer has been conventionally deposited more than 2 layers, at least. And, after each deposition step, a plasma treatment or $UV-O_3$ process has been additionally performed to remove reaction by-products inside the $Ta_2O_5$ layer. However, the above method has a demerit of increase in the number of the processes.

SUMMARY OF THE INVENTION

Accordingly, it is one object of the present invention to provide a capacitor for a semiconductor memory device with a dielectric layer having low leakage current and high dielectric constant.

Furthermore, the other object of the present invention is to provide a method of manufacturing a capacitor for a semiconductor memory device capable of simplifying manufacturing process thereof.

To achieve the foregoing objectives, a capacitor for a semiconductor memory device of the present invention according to one aspect includes: a lower electrode; a dielectric layer formed on the lower electrode; and an upper electrode formed on the upper part of the dielectric layer, wherein the dielectric layer is a $(TaO)_{1-x}(TiO)N$ layer.

Further, the present invention according to another aspect provides a method of manufacturing a capacitor of a semiconductor memory device including the steps of: forming a lower electrode on the semiconductor substrate; depositing a $(TaO)_{1-x}(TiO)N$ layer as a dielectric layer on the upper part of the lower electrode; and forming an upper electrode on the upper part of the $(TaO)_{1-x}(TiO)N$ layer.

And, the present invention according to still another aspect provides a method of manufacturing a capacitor of a semiconductor memory device including the steps of: forming a lower electrode on the semiconductor substrate; surface-treating to prevent a natural oxide layer from generating on the surface of the lower electrode; depositing the $(TaO)_{1-x}(TiO)N$ layer as a dielectric on the upper part of the lower electrode; diffusing and simultaneously crystallizing impurities inside the $(TaO)_{1-x}(TiO)N$ layer; and forming an upper electrode on the upper part of the $(TaO)_{1-x}(TiO)N$ layer, wherein the $(TaO)_{1-x}(TiO)N$ layer is formed by a surface chemical reaction of Ta chemical, Ti chemical vapor, $NH_3$ gas and $O_2$ gas in an LPCVD chamber maintaining a temperature of 300 to 600° C.

DETAILED DESCRIPTION OF THE PREFERRED EMBODIMENTS

Figure 1:
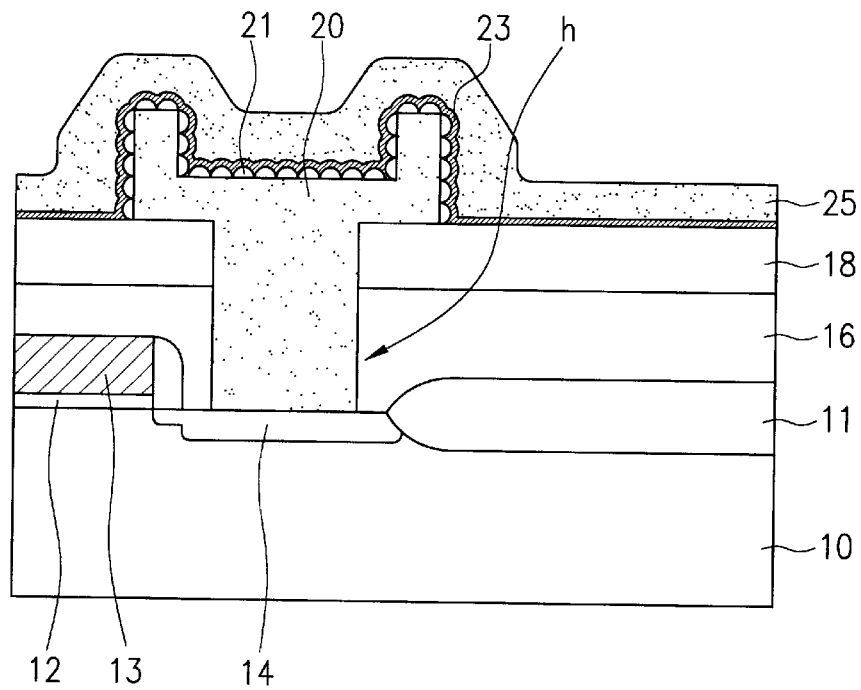
FIG. 1 is a cross-sectional view of a conventional capacitor for a semiconductor memory device.
Figure 2A:
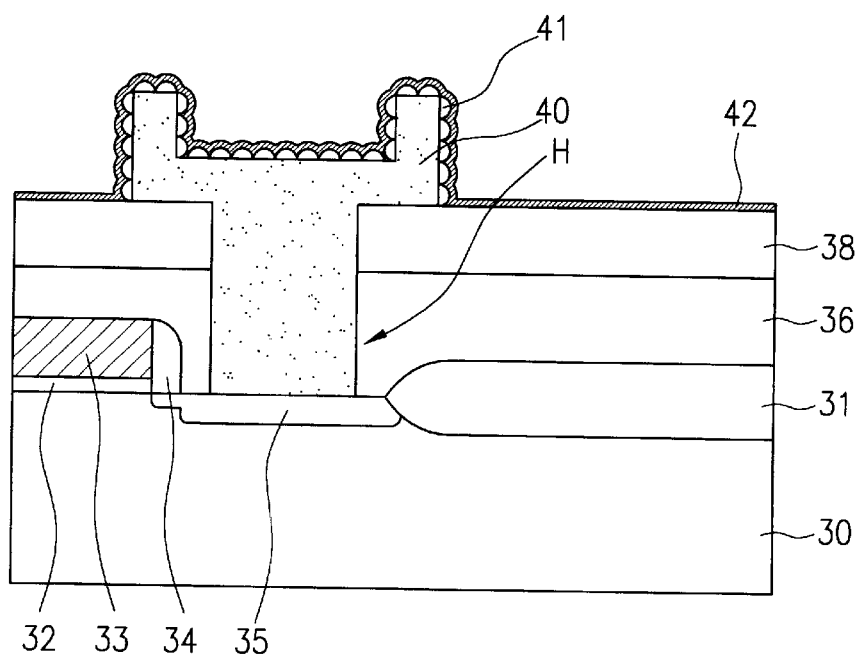
FIGS. 2A to 2D are cross-sectional views of respective processes for describing the method of manufacturing a capacitor for a semiconductor device according to the embodiment of the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed at a selected portion on the upper part of the semiconductor substrate 30, and a spacer 34 is formed according to a known method at both side-walls of the gate electrode 33. A junction region 35 is formed at both sides of the semiconductor substrate 30 on the gate electrode 33, thereby forming an MOS transistor. A first interlayer insulating layer 36 and a second interlayer insulating layer 38 are formed on the semiconductor substrate 30 which the MOS transistor is formed therein. Afterward, the second and the first interlayer insulating layers 38,36 are patterned so that a portion of the junction region 35 is exposed, thereby forming a storage node contact hole H. A lower electrode 40 of cylinder type or stack type is formed to be in contact with the exposed junction region 35. An HSG layer 41 for enlarging the surface area of the lower electrode 40 is formed according to a known method on the surface of the lower electrode 40.

Afterward, to restrain the generation of a low dielectric natural oxide layer at an interface of the lower electrode 40 having the HSG layer 41 and a dielectric layer to be formed later(not shown), the lower electrode 40 having the HSG layer 41 and the second interlayer insulating layer 38 are surface-treated. Herein, the surface-treatment can be performed in various methods. As one among the methods, a thermal treatment is performed in situ by using plasma in a low pressure chemical vapor deposition(LPCVD) chamber under $NH_3$ gas or $N_2/H_2$ gas atmosphere at temperature of 300~600° C. Further, as another method, the RTN is performed at temperature of 500~1000° C. under $NH_3$ gas atmosphere, or a furnace treatment is performed under the same conditions as above. As an additional method, the surface of the lower electrode 40 is cleaned by HF vapor, HF solution or compounds containing HF. At this time, before or after the cleaning step, an extra interface-treating step can be performed by $NH_4OH$ solution or $H_2SO_4$ solution. In addition to the interface-treating step, also a thermal process can be performed under $N_2O$ or $O_2$ gas atmosphere, thereby improving the structural defects as well as the structural heterogeneity due to the dangle bonds on the lower electrode surface. As a result, generation of the natural oxide layer is restrained. Herein, when the thermal process, the RTN or the furnace treatment using plasma under $NH_3$ gas atmosphere is performed, a silicon nitride layer 42 is naturally formed on the upper parts of the lower electrode 40 having the HSG layer 41 and the second interlayer insulating layer 38. In addition, when the silicon nitride layer is not formed naturally by the surface treatment, a silicon nitride layer 42 for restraint of the natural oxide layer is artificially deposited on the upper parts of the lower electrode 40 having the HSG layer 41 and the second interlayer insulating layer 38.

Figure 2B:
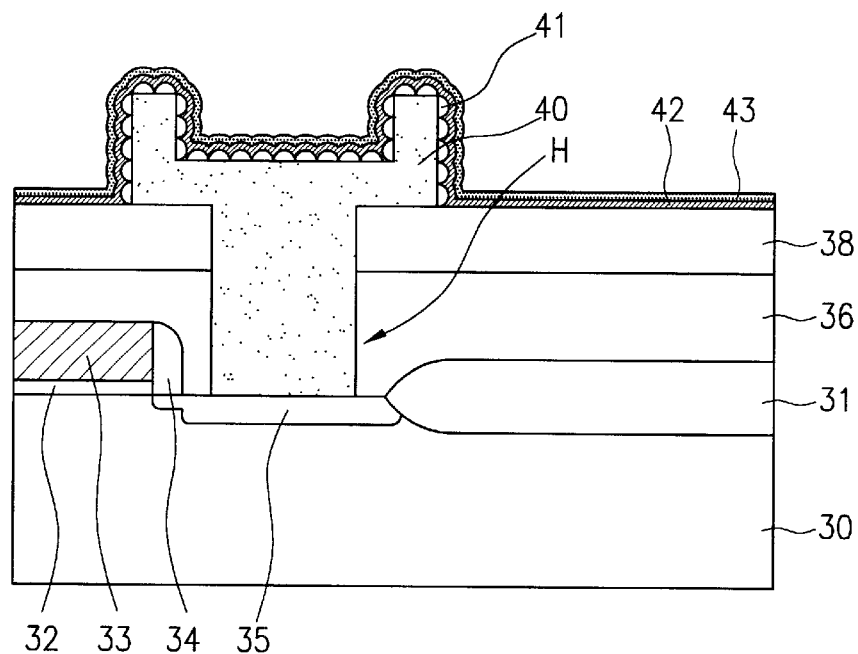

Referring to FIG. 2B, as a dielectric, a $(TaO)_{1-x}(TiO)N$ layer 43($0.01 \leq x \leq 0.09$) is formed on the upper part of the silicon nitride layer 42 and in an LPCVD chamber maintaining a temperature of 300 to 600° C. by a chemical reaction of Ta chemical vapor, Ti chemical vapor, $NH_3$ gas and $O_2$ gas. Herein, Ta chemical vapor is obtained by quantifying a precursor such as $Ta(OC_2H_5)_5$(tantalum ethylate), $Ta(N(CH_3)_2)_5$(penta-dimethyl-amino-tantalum) and then evaporating in an evaporation tube maintaining a temperature of 140 to 220° C., and Ti chemical vapor is obtained by quantifying a precursor such as $Ti[OCH(CH_3)_2]_4$(tantalum isopropylate), $TiCl_4$, TDMAT (tetrakis-dimethylamido-Ti), TDEAT(tetrakis-diethlamido-Ti) and evaporating in an evaporation tube maintaining a temperature of 200 to 300° C. At this time, Ta chemical vapor and Ti chemical vapor are supplied so that mole ratio of Ti/Ta is 0.01 to 1 and $NH_3$ gas and $O_2$ gas are respectively supplied in the range of 10 to 1000 sccm. When forming the $(TaO)_{1-x}(TiO)N$ layer 43, a gas phase reaction inside the chamber is restrained to a maximum extent while a chemical reaction is generated only on a wafer surface. In addition, the $(TaO)_{1-x}(TiO)N$ layer 43 is formed to the thickness of approximately 80 to 150 Å.

Figure 2C:
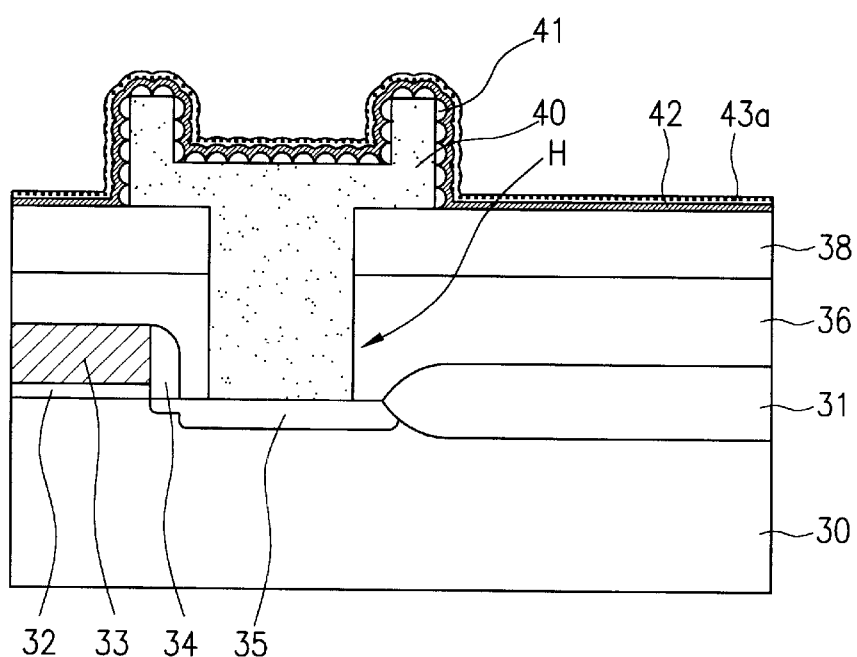

Afterward, as shown in FIG. 2C, to crystallize the $(TaO)_{1-x}(TiO)N$ layer 43 in an amorphous state and to outward-diffuse reaction by-products therein, the $(TaO)_{1-x}(TiO)N$ layer 43 is annealed by the RTP or a furnace at a temperature of 550~950° C. under a $N_2O(O_2$ or $N_2)$ gas atmosphere for 30 seconds to 30 minutes. As a result, the $(TaO)_{1-x}(TiO)N$ layer 43 in the amorphous state is converted into a crystalline $(TaO)_{1-x}(TiO)N$ layer 43a, thereby improving dielectric constant and outward-diffusing the remaining reaction by-products therein. Therefore, the source of leakage current is removed.

Figure 2D:
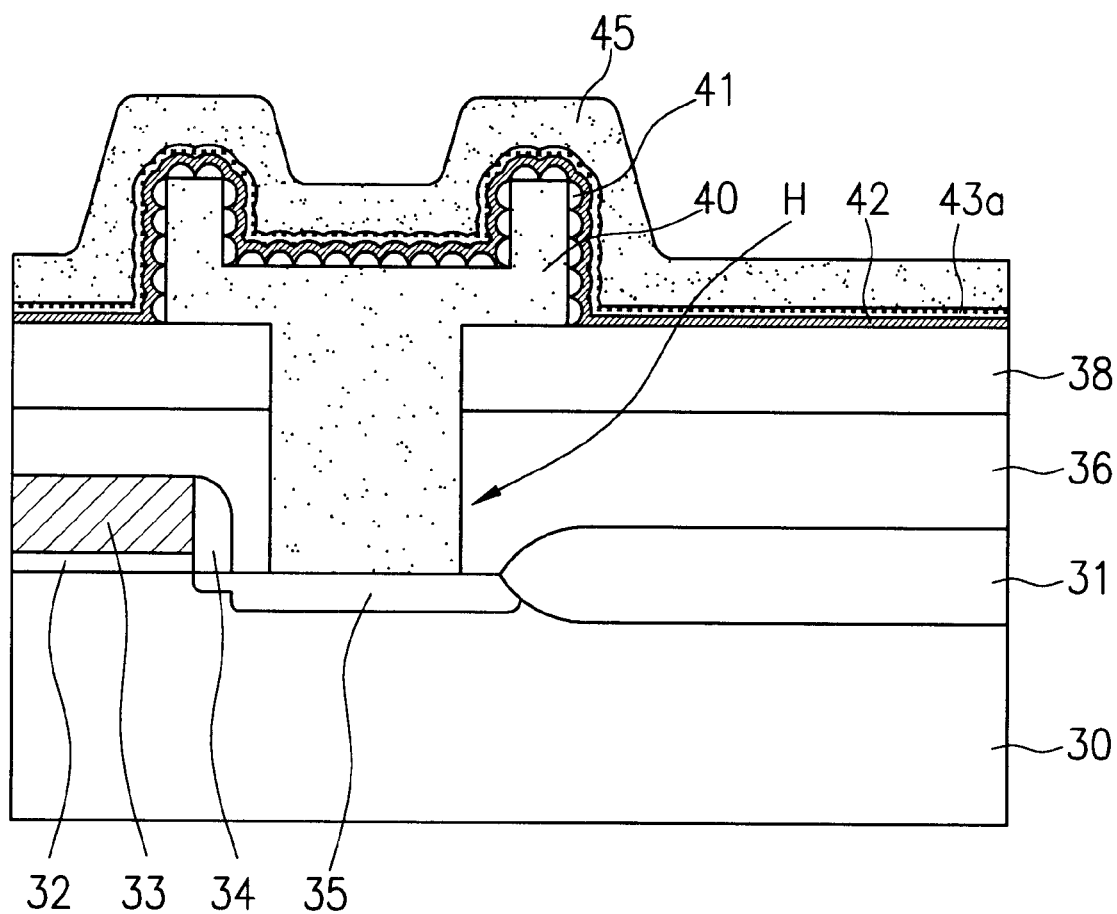

Then, as shown in FIG. 2D, an upper electrode 45 is formed on the upper part of the crystallized $(TaO)_{1-x}(TiO)N$ layer 43a. Herein, the upper electrode 45 can be made of a doped polysilicon layer or a metal layer. When the metal layer is used for the upper electrode 45, one among TiN, TaN, W, WN, WSi, Ru, $RuO_2$, Ir, $IrO_2$, and Pt is selected. When the metal layer can be formed according to a method among LPCVD, PECVD and RF magnetic sputtering methods.

As discussed above in detail, the followings are effects of using the $(TaO)_{1-x}(TiO)N$ layer as a dielectric.

First, the $(TaO)_{1-x}(TiO)N$ layer has high dielectric constant of more than 40, and can be applied to a capacitor of a large capacitance. And, the $(TaO)_{1-x}(TiO)N$ layer is covalent-bonded to $TiO_2$ having a grid structure of structurally-stable tetragonal system, thereby obtaining excellent mechanical and electric strengths as well as a stable structure.

Consequently, the $(TaO)_{1-x}(TiO)N$ layer has an excellent tolerance against external impacts and very low leakage current.

Furthermore, since the $(TaO)_{1-x}(TiO)N$ layer has more stable stoichiometry than that of the $Ta_2O_5$ layer, an extra low temperature oxidizing process for stabilizing the stoichiometry is not required. Consequently, process steps can be reduced.

Various other modifications will be apparent to and can be readily made by those skilled in the art without departing from the scope and spirit of the present invention.

What is claimed is:

1. A method of manufacturing a capacitor on a semiconductor substrate comprising the steps of:

forming a lower electrode on the semiconductor substrate;

depositing a $(TaO)_{1-x}(TiO)N$ layer as a dielectric layer on the upper part of the lower electrode; and forming an upper electrode on the upper part of the $(TaO)_{1-x}(TiO)N$ layer.

2. The method according to claim 1, wherein the $(TaO)_{1-x}(TiO)N$ layer is formed by a wafer surface chemical reaction of Ta chemical vapor, Ti chemical vapor, $NH_3$ gas and $O_2$ gas in a restraint state of a gas phase reaction in a low pressure chemical vapor deposition(LPCVD) chamber maintaining a temperature of 300 to 600° C.

3. The method according to claim 2, wherein the $NH_3$ gas and $O_2$ gas are supplied by 10 to 1000 sccm.

4. The method according to claim 2, wherein the Ta chemical vapor and Ti chemical vapor are supplied so that mole ratio of Ti/Ta is 0.01 to 1.

5. The method according to claim 4, wherein the Ta chemical vapor is obtained by evaporating an organic metal precursor containing tantalum at a temperature of 140 to 220° C.

6. The method according to claim 5, wherein the organic metal precursor containing tantalum is $Ta(OC_2H_5)_5$ or $Ta(N(CH_3)_2)_5$.

7. The method according to claim 4, wherein the Ti chemical vapor is obtained by evaporating an organic metal precursor containing titanium at a temperature of 200 to 300° C.

8. The method according to claim 7, wherein the organic metal precursor containing titanium is one selected among $Ti[OCH(CH_3)_2]_4$, $TiCl_4$, TDMAT and TDEAT.

9. The method according to claim 1, wherein a surface-treatment for preventing a natural oxide layer from generating on the surface of the lower electrode is additionally performed between the step of forming the lower electrode and the step of depositing the $(TaO)_{1-x}(TiO)N$ layer.

10. The method according to claim 9, wherein the surface-treatment is thermal-treated at a temperature of 300 to 600° C. in the LPCVD chamber using plasma having atmosphere of $NH_3$ gas or $N_2/H_2$ gas.

11. The method according to claim 9, wherein the surface-treatment is performed by the RTN at temperature of 500 to 1000° C. in a chamber having an NH, gas atmosphere.

12. The method according to claim 9, wherein the surface-treatment is thermal-treated at a temperature of 500 to 1000° C. in a furnace having $NH_3$ gas atmosphere.

13. The method according to claim 9, wherein during the surface-treatment, the surface of the lower electrode is cleaned by using HF vapor, HF solution, or a compound containing HF.

14. The method according to claim 13, wherein an interface-treatment is additionally performed by using $NH_4OH$ solution or $H_2SO_4$ solution before or after the cleaning step.

15. The method according to claim 9, wherein the surface-treatment is thermal-treated under atmosphere of $N_2O$ gas or $O_2$ gas.

16. The method according to claim 1, further comprising a step of crystallizing the $(TaO)_{1-x}(TiO)N$ layer and simultaneously outward-diffusing reaction by-products therein between the step of forming the $(TaO)_{1-x}(TiO)N$ layer and the step of forming the upper electrode.

17. The method according to claim 16, wherein the crystallizing and outward-diffusing step is performed by RTP under an atmosphere of $N_2O$ gas, $O_2$ gas or $N_2$ gas at a temperature of 550 to 950° C.

18. The method according to claim 16, wherein the crystallizing and outward-diffusing step is annealed by a furnace under an atmosphere of $N_2O$ gas, $O_2$ gas or $N_2$ gas at a temperature of 550 to 950° C.

19. A method of manufacturing a capacitor on a semiconductor substrate comprising the steps of:

forming a lower electrode on the semiconductor substrate;

surface-treating to prevent a natural oxide layer from generating on the surface of the lower electrode;

depositing the $(TaO)_{1-x}(TiO)N$ layer as a dielectric on the upper part of the lower electrode;

diffusing and simultaneously crystallizing impurities inside the $(TaO)_{1-x}(TiO)N$ layer; and forming an upper electrode on the upper part of the $(TaO)_{1-x}(TiO)N$ layer, wherein the $(TaO)_{1-x}(TiO)N$ layer is formed by a surface chemical reaction of Ta chemical, Ti chemical vapor, $NH_3$ gas and $O_2$ gas in an LPCVD chamber maintaining a temperature of 300 to 600° C.

20. The method according to claim 19, wherein the Ta chemical vapor and Ti chemical vapor are supplied so that mole ratio of Ti/Ta is 0.01 to 1.

21. The method according to claim 19, wherein the Ta chemical vapor is obtained by evaporating an organic metal precursor containing tantalum at a temperature of 140 to 220° C.

22. The method according to claim 19, wherein the organic metal precursor containing tantalum is $Ta(OC_2H_5)$ or $Ta(N(CH_3)_2)_5$.

23. The method according to claim 19, wherein the Ti chemical vapor is obtained by evaporating an organic metal precursor containing titanium at a temperature of 200 to 300° C.

24. The method according to claim 23, wherein the organic metal precursor containing is one selected among $Ti[OCH(CH_3)_2]_4$, $TiCl_4$, TDMAT and TDEAT.

25. The method according to claim 19, wherein the $NH_3$ gas and $O_2$ gas are supplied by 10 to 1000 sccm.

26. The method according to claim 19, wherein the surface treatment for preventing the generation of the natural oxide layer is thermal-treated at a temperature of 300 to 600° C. in an LPCVD chamber using a plasma having an atmosphere of $NH_3$ gas or $N_2/H_2$ gas.

27. The method according to claim 19, wherein the surface-treatment for preventing the generation of the natural oxide layer is performed by RTN at a temperature of 500 to 1000° C. in an LPCVD chamber having a $NH_3$ gas atmosphere.

28. The method according to claim 19, wherein the surface-treatment for preventing the generation of the natural oxide layer is performed at a temperature of 500 to 1000° C. in a furnace having an $NH_3$ gas atmosphere.

29. The method according to claim 19, wherein during the surface-treatment for preventing the generation of the natural oxide layer, the surface of the lower electrode is cleaned by HF vapor, HF solution or a compound containing HF.

30. The method according to claim 29, wherein before or after the cleaning step, a interface-treatment is additionally performed by $NH_4OH$ solution or $H_2SO_4$ solution.

31. The method according to claim 19, wherein the surface-treatment for preventing the natural oxide layer is thermal-treated under an atmosphere of $N_2O$ gas or $O_2$ gas.

32. The method according to claim 19, wherein the crystallizing and outward-diffusing step is performed by RTP under an atmosphere of $N_2O$ gas, $O_2$ gas, and $N_2$ gas at a temperature of 550 to 950° C.

33. The method according to claim 19, wherein the crystallizing and outward-diffusing step is annealed by a furnace under an atmosphere of $N_2O$ gas, $O_2$ gas, or $N_2$ gas at a temperature of 550 to 950° C.

* * * * *